(12) United States Patent
Iwasaki

(10) Patent No.: US 6,752,976 B2
(45) Date of Patent: Jun. 22, 2004

(54) INP SINGLE CRYSTAL SUBSTRATE

(75) Inventor: Koji Iwasaki, Chichibu (JP)

(73) Assignee: Showa Denko K.K., Tokyo (JP)

( * ) Notice: Subject to any disclaimer, the term of this patent is extended or adjusted under 35 U.S.C. 154(b) by 8 days.

(21) Appl. No.: 10/148,133

(22) PCT Filed: Sep. 27, 2001

(86) PCT No.: PCT/JP01/08436

§ 371 (c)(1),
(2), (4) Date: May 28, 2002

(87) PCT Pub. No.: WO02/29138

PCT Pub. Date: Apr. 11, 2002

(65) Prior Publication Data

US 2002/0179002 A1 Dec. 5, 2002

Related U.S. Application Data

(60) Provisional application No. 60/311,117, filed on Aug. 10, 2001.

(30) Foreign Application Priority Data

Sep. 29, 2000 (JP) ........................................ 2000-300027

(51) Int. Cl.[7] .............................................. C01B 33/26
(52) U.S. Cl. ......................... 423/328.2; 117/13; 117/17
(58) Field of Search ................... 117/13, 17; 423/328.2

(56) References Cited

FOREIGN PATENT DOCUMENTS

| EP | 0 567329 A2 | 10/1993 |
|---|---|---|
| EP | 0 701 008 A2 | 3/1996 |
| FR | 2 597 885 | 10/1987 |
| JP | 2-229796 | 9/1990 |
| JP | 4-55399 | 2/1992 |
| JP | 4-108696 | 4/1992 |
| JP | 7-193007 | 7/1995 |

OTHER PUBLICATIONS

International Search Report.
Patent Abstracts of Japan. vol. 014, No. 480 (C–0771), Oct. 19, 1990 & JP 02 199100 A, Aug. 7, 1990.
Patent Abstracts of Japan. vol. 1995, No. 10, Nov. 30, 1995 & JP 07 193007 A, Jul. 28, 1995.

*Primary Examiner*—Felisa C. Hiteshew
(74) *Attorney, Agent, or Firm*—Sughrue Mion, PLLC

(57) ABSTRACT

By using an InP single crystal substrate of the present invention in which the oxygen atom concentration is within the range of $1 \times 10^{17}$ to $1 \times 10^{18}$ atoms/cm$^3$ for vapor phase epitaxial growth such as the MOCVD method, the occurrence of protrusions referred to as hillocks on the surface of the epitaxial layer formed on the substrate can be reduced, thereby allowing the providing of an InP single crystal substrate able to accommodate reduced thickness, multi-layering and enhanced function of the epitaxial layer.

11 Claims, 1 Drawing Sheet

INP SINGLE CRYSTAL SUBSTRATE

CROSS-REFERENCE TO RELATED APPLICATION

This application claims the benefit pursuant to 35 U.S.C. §119 (e)(1) of U.S. Provisional Application No. 60/311,117 filed Aug. 10, 2001.

BACKGROUND OF THE INVENTION

1. Field of the Invention

The present invention relates to an InP single crystal substrate provided for fabrication of laser diodes, photodiodes and other optical communication devices, and more particularly, to an InP single crystal substrate in which the occurrence of defects in the surface of an epitaxial layer is held to a low level.

2. Description of the Related Art

InP single crystal substrates are used as substrates for fabricating laser diodes and photo diodes used in optical communications. In order to fabricate laser diodes and photo diodes, it is necessary to form a thin film consisting of a group III through V compound semiconductor and so forth by epitaxial growth on an InP single crystal substrate polished to a mirrored state. Epitaxial growth technologies using a liquid phase method or vapor phase method are used to grow this thin film. Recently, it has become necessary to reduce the thickness of the epitaxial layer grown on the InP single crystal substrate in order to get higher frequency response of these elements. However, as a result of decreasing the thickness of the epitaxial layer, the quality of the InP single crystal substrate has a considerable effect on the performance of the epitaxial layer.

One example of this is the defect of protrusions appearing on the surface of epitaxial wafers referred to as hillocks. Although the size of the hillocks varies according to the epitaxial conditions, they have a diameter of about 20 $\mu$m and height of about 5 nm.

In order to eliminate these hillocks, various accommodations have been adopted such as changing the composite ratio of the III–V compound semiconductor epitaxial layer, adjusting the substrate temperature during epitaxial growth, and giving a slight off angle to the surface orientation of the single crystal substrate. For example, Japanese Unexamined Patent Application, First Publication No. 07-193007 discloses the inclining of the surface orientation of a substrate only by an angle of 0.03–0.08° from an orientation of <100> to eliminate hillocks followed by performing epitaxial growth while restricting the substrate temperature to 700–800° C.

However, in the case of preventing the occurrence of hillocks by changing the epitaxial growth conditions, there was the problem of it being difficult to obtain an epitaxial layer offering the desired level of performance. In addition, in the case of preventing hillocks by giving an off angle to an InP single crystal substrate, there was the problem of microscopic defects appearing in the epitaxial layer thereby causing poor uniformity of the film.

In consideration of the above problems, the object of the present invention is to provide an InP single crystal substrate that inhibits the occurrence of hillocks on an epitaxial wafer surface.

BRIEF SUMMARY OF THE INVENTION

The inventors of the present invention achieved the present invention as a result of earnest efforts and studies to solve the above problems. Namely, the present invention is:

[1] an InP single crystal substrate characterized in that, the oxygen atom concentration in the InP single crystal substrate is within the range of $1\times10^{17}$ atoms/cm$^3$ to $1\times10^{18}$ atoms/cm$^3$;

[2] the InP single crystal substrate according to [1] wherein, the off angle of the surface orientation of the InP single crystal substrate is less than ±0.03°;

[3] the InP single crystal substrate according to [2] wherein the surface orientation of the InP single crystal substrate is <100>;

[4] a production process of the InP single crystal substrate according to any of [1] through [3] comprising: growing InP single crystal using a raw material containing indium oxide and/or phosphorous oxide followed by processing the grown single crystal on a substrate;

[5] a production process of the InP single crystal substrate according to any of [1] through [3] comprising: adding indium oxide and/or phosphorous oxide to an encapsulant in the form of $B_2O_3$, growing InP single crystal according to the liquid encapsulated Czochralski method, and then processing the grown single crystal on a substrate;

[6] an InP single crystal substrate fabricated using the production process according to [4] or [5]; and,

[7] a laser diode or photo diode fabricated using the InP single crystal substrate according to [1] through [3] or [6].

[8] an epitaxial wafer for the laser diode or photo diode fabricated using the InP single crystal substrate according to [1] through [3] or [6].

DETAILED DESCRIPTION OF THE INVENTION

Figure 1:
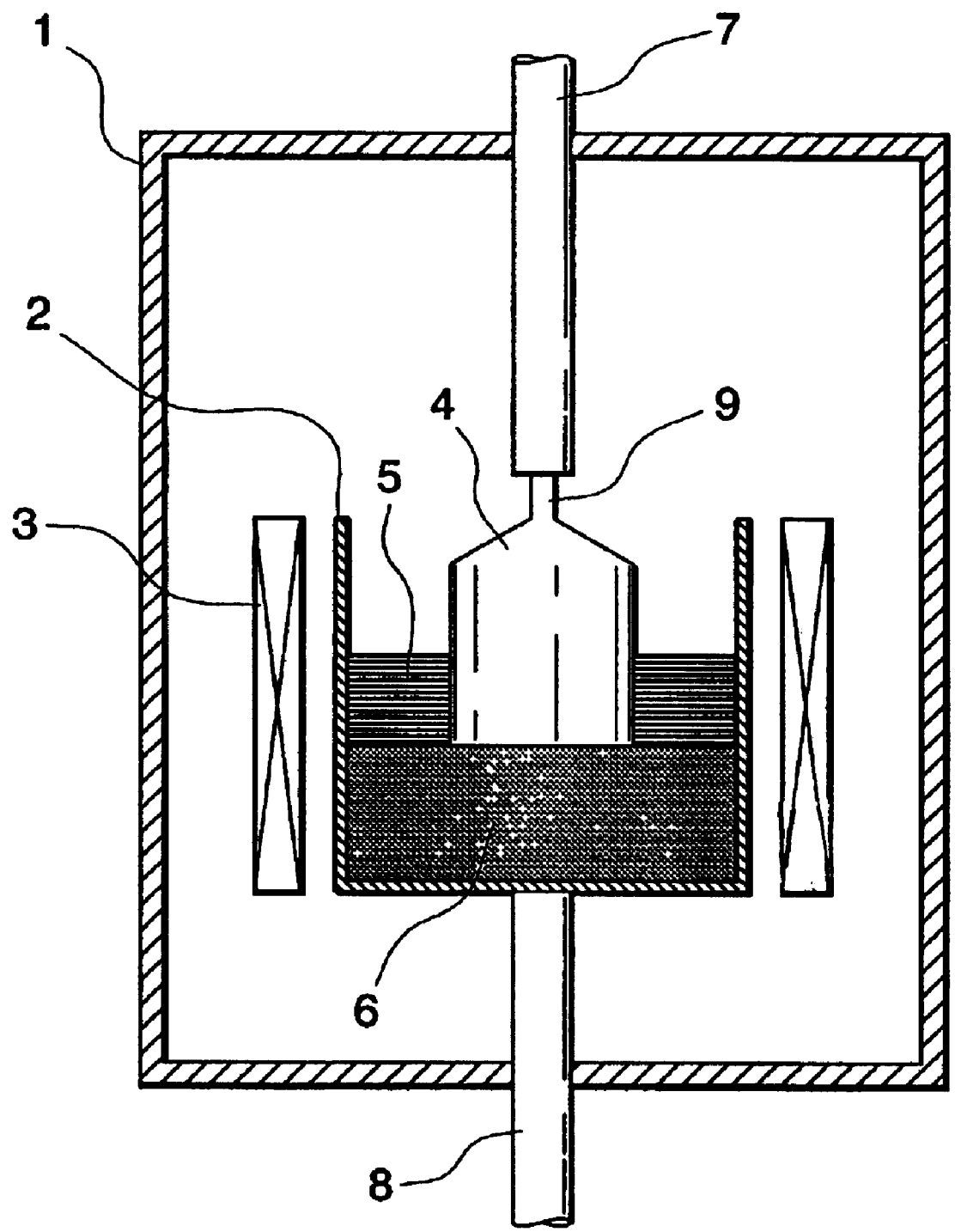
FIG. 1 is a schematic structural drawing of a single crystal growth apparatus.

The InP single crystal substrate of the present invention is fabricated by slicing an InP single crystal into the shape of a wafer with an inner diameter blade saw and so forth followed by polishing to a mirrored state. In the present invention, by making the oxygen atom concentration in this InP single crystal substrate to be within the range of $1\times10^{17}$ to $1\times10^{18}$ atoms/cm$^3$, the amount of hillocks formed in the epitaxial layers grown on top of it is drastically reduced, thereby making it possible to accommodate reducing the thickness and enhancing the function of the laminated epitaxial layers. Although it is necessary that the oxygen atom concentration in the InP single crystal substrate be within the range of $1\times10^{17}$ to $1\times10^{18}$ atoms/cm$^3$, if the oxygen atom concentration is more preferably $1.5\times10^{17}$ to $5\times10^{17}$ atoms/cm$^3$, and most preferably $2\times10^{17}$ to $4\times10^{17}$ atoms/cm$^3$, the amount of hillocks formed in the epitaxial layer can be even further reduced.

Although the details of the reason for the hillocks on the surface of the epitaxial layer formed on the InP single crystal substrate decreasing as a result of making the oxygen atom concentration in the InP single crystal substrate to be within this range are unknown, it is thought that the strain of areas surrounding dislocation is changed by oxygen present in the InP single crystal substrate.

InP single crystal can generally be grown according to the liquid encapsulated Czochralski (LEC) method. More recently, it has also been grown by vertical boat methods referred to as the VG method and VGF method. In the case of growing InP single crystal by these methods, boric oxide ($B_2O_3$) is typically used as a liquid encapsulant to prevent dissociation of phosphorous from the raw material melt containing indium and phosphorous. Although there are cases in which oxygen dissolves in the InP melt from this $B_2O_3$ and mixes with the oxygen atoms present in the InP single crystal, contamination of the InP melt with oxygen atoms from $B_2O_3$ only involves an extremely small amount, and is unable to increase the oxygen atom concentration in the InP single crystal to the range of $1\times10^{17}$ to $1\times10^{18}$ atoms/cm$^3$ of the present invention. Consequently, in the present invention, it is preferable to add an oxide that is more easily degraded than $B_2O_3$ such that oxygen easily dissolves in the InP melt in order to increase the oxygen atom concentration in the InP single crystal. As examples of such oxides, $In_2O_3$ and $P_2O_5$, which are oxides of indium and phosphorous that are the main constituents of InP single crystal, are used most suitably.

Examples of methods for adding these oxides to InP single crystal include a method in which a polycrystalline raw material having a high oxygen atom concentration is fabricated in advance by adding indium oxide and/or phosphorous oxide when manufacturing a polycrystalline raw material using for growing InP single crystal, and a method in which a polycrystalline raw material along with indium oxide and/or phosphorous oxide are placed in the crucible of an LEC furnace when growing single crystal with the LEC method. In addition, there is also a method in which indium oxide and/or phosphorous oxide are added in advance to $B_2O_3$ encapsulant.

The amount of oxide added in this case is preferably (number of In and P atoms in InP polycrystalline raw material):(number of O atoms)=100,000:1 to 50,000,000:1 in the case of adding oxide to InP polycrystalline raw material, or preferably (number of In and P atoms in InP polycrystalline raw material):(number of O atoms other than $B_2O_3$ in encapsulant)=5:1 to 100:1 in the case of adding oxide to encapsulant.

Furthermore, the oxygen atom concentration in the InP single crystal substrate of the present invention may be interpreted to have the same meaning as the oxygen atom concentration in InP single crystal prior to processing into a substrate.

The InP single crystal substrate of the present invention can be made into a substrate more suitable for formation of epitaxial layers by using a single crystal substrate that is not given an off angle. In the case of conventional InP single crystal substrates, although the giving of an off angle prevented the occurrence of hillocks during the epitaxial layer growth, in the InP single crystal substrate of the present invention, this is no longer necessary, and reduced thickness and multi-layering of epitaxial layers that were unable to be obtained in the prior art can be achieved by using a single crystal substrate not having an off angle. A single crystal substrate that does not have an off angle is that in which the off angle relative to the surface orientation of the substrate is less than ±0.03°, and more preferably less than ±0.02°.

In addition, the preferable surface orientation of the InP single crystal substrate of the present invention is <100>. As a result of having this surface orientation, an InP single crystal substrate can be provided that is more resistant to the occurrence of hillocks.

EXAMPLES

Although the following provides a more detailed description of the InP single crystal substrate of the present invention through its embodiments, the present invention is not limited to these examples.

Example 1

1000 g of InP polycrystalline raw material having a purity of 6 N, 0.4 g of $In_2S_3$ as dopant, 0.3 g of $In_2O_3$ and 300 g of $B_2O_3$ as encapsulant were placed in a PBN crucible 2 having a diameter of 100 mm and placed in a single crystal growth furnace 1. The atmosphere in the furnace was replaced with argon gas, and direct current was applied to a heater 3 followed by heating to 1300° C. to melt the $B_2O_3$, InP raw material and indium oxide in the crucible 2 and form a $B_2O_3$ encapsulant layer 5 and an InP melt 6.

After melting for 3 hours, InP seed crystal 9 attached to the lower end of an upper rod 7 was contacted with the InP melt 6, and the seed crystal was pulled up at the rate of 9 mm/h while rotating the seed crystal and crucible 2 (which is attached to a lower rod 8) in opposite directions at a relative rotation rate of 30 rpm to grow InP single crystal 4 having a diameter of 2 inches.

After cutting this crystal into the shape of a thin wafer with an inner diameter blade saw, the wafer was polished to a mirrored state. When the surface orientation of this mirrored wafer was measured by X-ray, the off angle from the (100) plane was 0.01°.

As a result of analyzing the oxygen atom concentration in the InP single crystal substrate obtained in this manner by secondary ion mass spectrometry (SIMS), the oxygen atom concentration in the crystal was $1.3\times10^{17}$ atoms/cm$^3$.

After light etching the surface of the wafer after polishing to remove the damaged layer, a thin epitaxial layer of an InGaAs was grown at a substrate temperature of 650° C. by the MOCVD method. In order to fit the lattice constant of the epitaxial layer into that of InP substrate, the composite ratio of In and Ga (In:Ga) was made to be 0.53:0.47.

When the surface of the above epitaxial wafer was observed using a Nomarski e microscope at a magnification of 100x, there were no protrusions referred to as hillocks observed whatsoever.

Example 2

1000 g of InP polycrystalline raw material and 0.4 g of $In_2S_3$ as dopant were placed in a PBN crucible in the same manner as Example 1. In the present embodiment, 300 g of $B_2O_3$ containing $P_2O_5$ at a weight ratio of 7% instead of $In_2O_3$ were added to the crucible. This crucible was then placed in a single crystal growth furnace, and single crystals having a diameter of 2 inches were grown according to the same procedure as Example 1.

As a result of analyzing the oxygen atom concentration in the InP single crystal substrate obtained in this manner by SIMS, the oxygen atom concentration was $2.1\times10^{17}$ atoms/cm$^3$.

An epitaxial layer was grown on this single crystal substrate under the same conditions as Example 1. When the surface of this epitaxial wafer was observed microscopically, there were no hillocks observed in the same manner as Example 1.

Example 3

2500 g of metal In were placed in a PBN boat, and this was then vacuum-sealed in a quartz ampule with 800 g of red phosphorous and 5 g of $P_2O_5$. This quartz ampule was placed in a horizontal high-pressure oven and the boat containing the In was heated to 1100° C. while the red phosphorous and $P_2O_5$ were heated to 550° C. to synthesize InP polycrystal. 1000 g of this InP polycrystal and 0.4 g of $In_2S_3$ as dopant were placed in the same PBN crucible as Example 1, followed by the addition of 300 g of $B_2O_3$ to the crucible. This crucible was then placed in a single crystal growth furnace to grow single crystals having a diameter of 2 inches according to the same procedure as Example 1.

As a result of analyzing the oxygen atom concentration in the InP single crystal substrate obtained in this manner by SIMS, the oxygen atom concentration was $3.5 \times 10^{17}$ atoms/$cm^3$.

An epitaxial layer was grown on this single crystal substrate under the same conditions as Example 1. When the surface of this epitaxial wafer was observed microscopically, there were no hillocks observed in the same manner as Example 1.

Comparative Example 1

1000 g of InP polycrystalline raw material, 0.4 g of $In_2S_3$ as dopant and 300 g of $B_2O_3$ were placed in the same PBN crucible as Example 1, and the crucible was then placed in a single crystal growth furnace. Single crystals having a diameter of 2 inches were grown according to the same procedure as Example 1 to fabricate a single crystal substrate.

As a result of analyzing the oxygen atom concentration in this single crystal substrate by SIMS, the oxygen atom concentration was less than the analysis lower limit value of $2 \times 10^{16}$ atoms/$cm^3$.

These crystals were processed into the form of a mirrored wafer according to the same procedure as Example 1 followed by epitaxial growth. When the surface of this epitaxial wafer was observed microscopically, hillocks measuring 20 µm were observed at the density of 500/$cm^2$, which is nearly the same density as the dislocation of the single crystal substrate.

Comparative Example 2

1000 g of InP polycrystalline raw material, 0.4 g of $In_2S_3$ as dopant and 0.2 g of $In_2O_3$, which is less than the amount used in Example 1, were placed in the same PBN crucible of Example 1 followed by the addition of 300 g of $B_2O_3$ to the crucible and growing single crystals having a diameter of 2 inches according to the same procedure as Example 1 to fabricate a single crystal substrate.

As a result of analyzing the oxygen atom concentration of this single crystal substrate by SIMS, it was found to be $7 \times 10^{16}$ atoms/$cm^3$.

These crystals were processed into the form of a mirrored wafer according to the same procedure as Example 1 followed by epitaxial growth. When the surface of this epitaxial wafer was observed microscopically, hillocks measuring 20 µm were observed at the density of 500/$cm^2$ in the same manner as Comparative Example 1.

Comparative Example 3

1000 g of InP polycrystalline raw material, 0.4 g of $In_2S_3$ as dopant and 3 g of $In_2O_3$, which is greater than the amount used in Example 1, were placed in the same PBN crucible of Example 1 followed by the addition of 300 g of $B_2O_3$ to the crucible and growing single crystals having a diameter of 2 inches according to the same procedure as Example 1 to fabricate a single crystal substrate.

As a result of analyzing the oxygen atom concentration of this single crystal substrate by SIMS, it was found to be $1.5 \times 10^{18}$ atoms/$cm^3$.

These crystals were processed into the form of a mirrored wafer according to the same procedure as Example 1 followed by epitaxial growth. When the surface of this epitaxial wafer was observed microscopically, although there were no hillocks observed, slipping was observed around the wafer periphery.

INDUSTRIAL APPLICABILITY

By using an InP single crystal substrate of the present invention in which the oxygen atom concentration is within the range of $1 \times 10^{17}$ to $1 \times 10^{18}$ atoms/$cm^3$ for vapor phase epitaxial growth such as the MOCVD method, the occurrence of protrusions referred to as hillocks on the surface of the epitaxial layer formed on the substrate can be reduced, thereby allowing the providing of an InP single crystal substrate able to accommodate reduced thickness, multi-layering and enhanced function of the epitaxial layer.

Although epitaxial growth conditions were determined in the prior art by balancing the performance of the epitaxial layer and conditions under which hillocks do not occur, according to the InP single crystal substrate of the present invention, since it is no longer necessary to consider the occurrence of hillocks, the laminated structure of the epitaxial layer can be determined only for improving the performance of the epitaxial layer, and the use of this epitaxial layer laminate has made it possible to provide laser diodes and photo diodes offering enhanced functions.

In particular, if the surface orientation of the InP single crystal substrate is <100> and the off angle is less than ±0.03°, laser diodes and photo diodes can be provided that offer even higher performance and more enhanced functions.

What is claimed is:

1. An InP single crystal substrate, in which the oxygen atom concentration in the InP single crystal substrate is within the range of $1 \times 10^{17}$ atoms/$cm^3$ to $10^{18}$ atoms/$cm^3$ and the off angle of the surface orientation of the InP single crystal substrate is less than ±0.03°.

2. The InP single crystal substrate according to claim 1 wherein the surface orientation of the InP single crystal substrate is <100>.

3. A production process of the InP single crystal substrate according to claim 1 or 2 comprising the steps of:

growing InP single crystal using a raw material containing indium oxide and/or phosphorous oxide; and processing the grown InP single crystal into a substrate.

4. An InP single crystal substrate fabricated using the production process according to claim 3.

5. A laser diode or photo diode fabricated using the InP single crystal substrate according to claim 4.

6. An epitaxial wafer for a laser diode or photodiode fabricated using the InP single crystal substrate according to claim 4.

7. A production process of the InP single crystal substrate according to claim 1 or 2 comprising the steps of:

adding indium oxide and/or phosphorous oxide to an encapsulant in a liquid form of $B_2O_3$, growing InP single crystal according to the liquid encapsulated Czochralski method while InP melt is covered with the liquid encapsulant, and processing the grown InP single crystal into a substrate.

8. An InP single crystal substrate fabricated using the production process according to claim 7.

9. A laser diode or photo diode fabricated using the InP single crystal substrate according to any one of claims 1 or 2.

10. An epitaxial wafer for a laser diode or photodiode fabricated using the InP single crystal substrate according to any one of claims 1 or 2.

11. The InP single crystal substrate according to claim 1 or 2, wherein the off angle is less than ±0.02°.

* * * * *